United States Patent [19]

Komoda

[11] Patent Number: 5,781,848
[45] Date of Patent: Jul. 14, 1998

[54] MOBILE TELEPHONE DEVICE WHEREIN A COMPRESSOR CIRCUIT PERFORMS AMPLITUDE COMPRESSION SUCH THAT A LESS VARIABLE GAIN IS GIVEN TO AN AUDIO SIGNAL HAVING A LOWER LEVEL RANGE THAN AN AUDIO SIGNAL HAVING A HIGHER LEVEL RANGE

[75] Inventor: Motoyoshi Komoda, Tokyo, Japan

[73] Assignee: NEC Corporation, Tokyo, Japan

[21] Appl. No.: 601,503

[22] Filed: Feb. 14, 1996

Related U.S. Application Data

[62] Division of Ser. No. 881,216, May 11, 1992, Pat. No. 5,640,685.

[30] Foreign Application Priority Data

May 21, 1991 [JP] Japan ............... 3-116275

[51] Int. Cl.⁶ ....................................... H04B 7/00
[52] U.S. Cl. ................... 455/72; 455/575; 381/106; 333/14
[58] Field of Search .................. 455/34.2, 38.1, 455/38.5, 69, 72, 78, 126, 210, 211, 307, 308, 309, 575; 379/58, 67; 370/7; 381/29, 94, 106; 333/14, 16

[56] References Cited

U.S. PATENT DOCUMENTS

| | | |
|---|---|---|
| 2,248,757 | 7/1941 | Herold ............................ 370/7 |
| 3,602,818 | 8/1971 | Andercecht ...................... 455/72 |
| 3,757,254 | 9/1973 | Takahashi et al. ................ 455/72 |
| 3,919,654 | 11/1975 | Toumani . |
| 3,930,208 | 12/1975 | Winter et al. .................... 333/14 |
| 4,025,853 | 5/1977 | Addeo ............................. 325/55 |
| 4,034,295 | 7/1977 | Kotezawa et al. ................ 455/72 |
| 4,295,223 | 10/1981 | Shutterly ......................... 455/72 |
| 4,430,754 | 2/1984 | Ishigaki et al. .................. 455/72 |
| 4,449,106 | 5/1984 | Ishigaki et al. .................. 455/72 |
| 4,823,380 | 4/1989 | Kohen et al. .................... 381/61 |
| 4,823,392 | 4/1989 | Walker ........................... 381/106 |
| 4,910,792 | 3/1990 | Takahata et al. ................. 455/69 |
| 5,095,539 | 3/1992 | Leveque ......................... 455/72 |
| 5,133,014 | 7/1992 | Pritchard ......................... 381/61 |
| 5,144,675 | 9/1992 | Killion et al. .................... 381/104 |
| 5,493,699 | 2/1996 | Shioda et al. .................... 455/72 |

*Primary Examiner*—Edward F. Urban
*Attorney, Agent, or Firm*—Sughrue, Mion, Zinn, Macpeak & Seas, PLLC

[57] ABSTRACT

In a mobile telephone device, the audio compressor (21) performs amplitude compression by giving a less variable gain to an input audio signal which is of a lower level range than it does for an input audio signal which is of a higher level range. Alternatively, an adder (17) calculates a sum of (a) an audio signal comprising a talk signal component and a noise component, and (b) a generated signal having an out-of audio frequency, as 6 kHz, and a predetermined level and supplies the compressor (21) with the sum as its input signal. A compressed signal is transmitted to a base station as a radio signal and is expanded.

2 Claims, 5 Drawing Sheets

MOBILE TELEPHONE DEVICE WHEREIN A COMPRESSOR CIRCUIT PERFORMS AMPLITUDE COMPRESSION SUCH THAT A LESS VARIABLE GAIN IS GIVEN TO AN AUDIO SIGNAL HAVING A LOWER LEVEL RANGE THAN AN AUDIO SIGNAL HAVING A HIGHER LEVEL RANGE

This is a divisional of application Ser. No. 07/881,216 filed May 11, 1992 now U.S. Pat. No. 5,640,688.

BACKGROUND OF THE INVENTION

This invention relates to a mobile telephone device, which may be a portable radio telephone device, namely, a portable telephone device for producing a radio output signal carrying an audio or audio-frequency signal.

Such a portable telephone device comprises a microphone for producing a talk or voice signal in response to a talk or speech spoken thereto by a user of the portable telephone device. While carried by the user, the portable telephone device is inevitably used in a noisy place where noise has an appreciably high noise level as a surrounding noise. Under such circumstances, the microphone produces an audio signal which comprises a talk signal component obtained from the talk signal and a noise component resulting from the surrounding noise.

It is well known in the art of telephony to use a compressor circuit on a transmitting side in order to raise a signal-to-noise (S/N) ratio. A compressor circuit is consequently used in the portable telephone device to produce a compressed signal by subjecting the audio signal to amplitude compression. A radio transmission arrangement transmits the compressed signal as a radio output signal to a base station. Receiving the radio output signal as a radio reception signal, the base station sends the radio reception signal after amplitude expansion to a counterpart substation which may either be one of fixed telephone units or substations or be one of similar other portable telephone devices.

In the manner which will later be described more in detail, the compressor circuit is for subjecting a circuit input signal to the amplitude compression and for thereby producing the compressed signal. In a conventional portable telephone device, the audio signal alone is supplied to the compressor circuit as the circuit input signal. Despite use of the compressor circuit in the portable telephone device and of an expander circuit in the base station, the noise component is unavoidably transmitted to the counterpart substation to be heard as noise by an attendant to the counterpart substation particularly during a pause in the talk. This annoys the attendant.

On the other hand, a cellular-type radio communication system is disclosed in U.S. Pat. No. 4,025,853 issued to Eric John Addeo and assigned to Bell Telephone Laboratories, Incorporated. The radio communication system is for a plurality of mobile telephone devices, each of which may not necessarily be a motor-vehicle-mounted unit but may be a portable telephone device of the type described. At any rate, the mobile telephone device are for use in a service area of a base station.

In the Addeo patent, the base station is called a mobile telecommunication switching office. The service area is called a mobile communication area and is covered by a honeycomb type of cellular overlay which is divided into cell sets. Each cell set consists of several cells, such as seven cells. A predetermined number of communication channels are used in common to the cells of the cell sets by a cell site or station in each cell.

According to Addeo, each cell site transmits some communication channels with an individual supervisory audible tone (SAT) of about 6 kHz superposed thereon as a unique tone. Herein, one of the cell sites will be called a particular site. One of the mobile telephone devices will be called a particular device. It will be assumed that this one of the mobile telephone devices is used in the cell in which the particular site is.

The particular device receives one of the communication channels as a received signal and separates the supervisory audible tone as a separated audible tone from the received signal. Using the separated audible tone, the particular device transmits a verification signal carrying a reference tone which is related to the separated audible tone. Responsive to the verification signal, the particular site judges whether or not the separated audible tone is coincident with the unique tone.

SUMMARY OF THE INVENTION

In consideration of noise which is inevitably undesiredly transmitted to a counterpart substation, it is a general object of the present invention to provide a mobile telephone device which does not annoy an attendant to the counterpart substation by the noise even when the mobile telephone device is unavoidably used in a noisy place.

It is another general object of this invention to provide a mobile telephone device which is of the type described and which comprises an adder or summing circuit for producing a sum signal of an audio or voice-frequency signal and an out-of audio frequency band signal and a compressor circuit for subjecting the sum signal to amplitude compression.

It is a specific object of this invention to provide a mobile telephone device which is of the type described and is for use in a radio communication system of the type revealed in the above-referenced U.S. Pat. No. 4,025,853 and in which the above-mentioned separated audible or reference tone is used as the out-of audio frequency band signal.

Other objects of this invention will become clear as the description proceeds.

On setting forth the gist of this invention, it is possible to understand that a mobile telephone device is for producing a radio output signal carrying an audio signal and includes a compressor circuit for subjecting a circuit input signal to amplitude compression to produce a compressed signal.

According to this invention, the above-understood mobile telephone device comprises: (A) a signal generator for generating a generated signal in an out-of audio frequency band; (B) a summing circuit for summing the audio signal and the generated signal into a sum signal; (C) supply means for supplying the sum signal to the compressor circuit as the circuit input signal; and (D) radio transmitting means for transmitting the compressed signal as the radio output signal.

DESCRIPTION OF THE PREFERRED EMBODIMENTS

Figure 1:
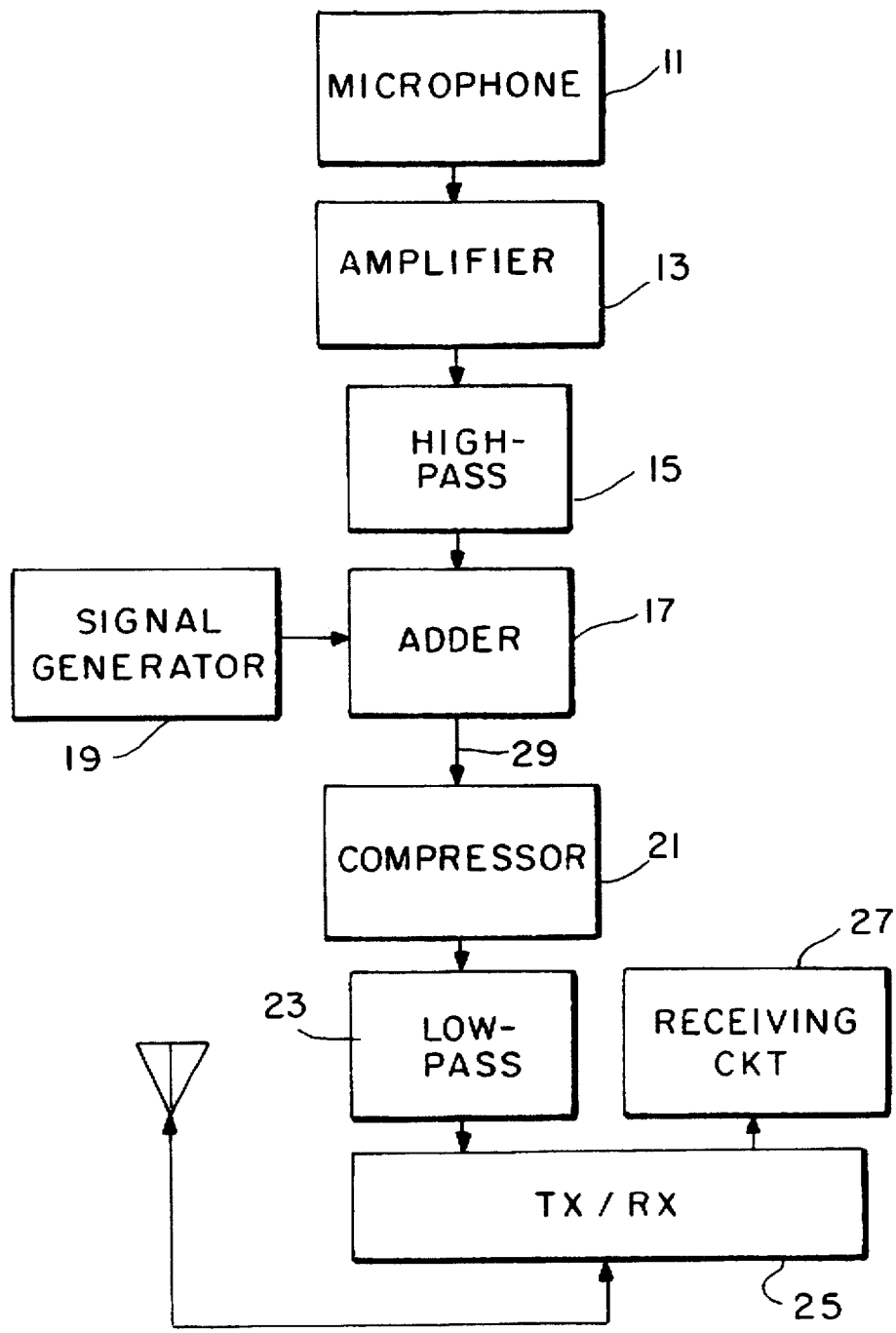
FIG. 1 is a block diagram of a portable telephone device according to a first embodiment of the instant invention.

Referring to FIG. 1, the description will begin with a portable telephone device according to a first embodiment of the present invention. The portable telephone device is a portable radio telephone device for producing a radio output signal which carries an audio or audio-frequency signal for transmission to a base station (not shown).

In the portable telephone device, a microphone 11 is preferably an electret capacitor microphone because of its excellent linearity. At any rate, the microphone 11 produces a talk or voice signal in response to a talk or speech spoken thereto by a user of the portable telephone device. While carried by the user, the portable telephone device is unavoidably used in a noisy place where noise has an appreciably high noise level as a Surrounding noise. In this event, the microphone 11 produces an audio signal which comprises a noise component in addition to a talk signal component obtained from the talk signal. It will be surmised that the noise component is a component of the audio signal other than the talk signal component. Accordingly, the noise component results primarily from the surrounding noise and has a noise frequency which may range from a voice frequency to an ultra voice frequency.

A microphone amplifier 13 amplifies the audio signal into an amplified signal. A high-pass filter 15 has a passband which is higher than about 300 Hz. Supplied with the amplified signal, the high-pass filter 15 supplies a high-pass filtered signal to a summing circuit or adder 17 as a summing circuit input signal.

A signal generator 19 is for generating a generated signal in an out-of audio or voice frequency band, for example, at about 6 kHz which is an audible frequency. Supplied with the generated signal as an additional input signal, the summing circuit 17 produces a sum signal by summing the summing circuit input signal, namely, the high-pass filtered signal, and the generated signal altogether.

A compressor circuit 21 is preferably an integrated circuit which is manufactured and sold by NEC Coprotation, Tôkyô, Japan, under a trade name of μPC15715C and which can be used as an expander circuit. Alternatively, the compressor circuit 21 may be an equivalent of the integrated circuit. Supplied with a compressor circuit input signal with a compressor input level, the compressor circuit 21 produces a compressed signal by subjecting the compressor circuit input signal to amplitude compression with a compressor gain which is typically inversely proportional to a square root of a mean or average value of the compressor input level.

Inasmuch as the sum signal is used as the compressor circuit input signal, the compressed signal comprises an audio frequency component and an out-of audio frequency component when attention is directed to its frequency. In the manner well known in the art of telephony, such a compressor circuit is used on a transmitting side in order to raise a signal-to-noise (S/N) ratio of the radio output signal.

In a conventional portable telephone device, the compressor circuit 21 is supplied with either the audio signal or the filtered signal. In such an event, an appreciable amount of the noise component remains as a remaining component in the radio output signal produced by the conventional portable telephone device and is transmitted to the base station and from the base station further towards a counterpart substation which may either be one of fixed telephone units or substations connected to the base station either directly or, more in general, through one or more switching offices (not shown) or be one of like other portable telephone devices which are served by the base station. The remaining component is inevitably heard as a remaining noise by an attendant to the counterpart substation particularly during a pause or pauses in the talk. The remaining noise is disagreeable to the attendant.

In marked contrast, the illustrated compressor circuit 21 is supplied with the sum signal as the compressor circuit input signal. This astonishingly reduces the remaining component of the surrounding noise in the radio output signal in the manner which will become clear as the description proceeds.

In FIG. 1, the portable telephone device preferably comprises a low-pass filter 23 having a passband which is lower than about 3 kHz. Supplied with the compressed signal, the low-pass filter 23 produces a low-pass filtered signal which consists essentially of the audio frequency component with the out-of audio frequency component removed therefrom. Supplied with the low-pass filtered signal, a device radio transminter/receiver (TX/RX) 25 serves as a transmission circuit in modulating a carrier signal by the low-pass filtered signal into the radio output signal for transmission to the base station.

Although details are not depicted because they are not different from those well known, the base station comprises a station radio transmitter/receiver for receiving the radio output signal as a radio reception signal from the portable telephone device being illustrated and for demodulating the radio reception signal into a demodulated signal. An expander circuit produces an expanded signal by subjecting the demodulated signal to amplitude expansion which is complementary to the amplitude compression carried out on the transmitting side. A repeating circuit sends the expanded signal towards one of the fixed telephone units that is selected as the counterpart substation. Alternatively, the expanded signal is supplied to the station radio transmitter/receiver for transmission as a radio transmission signal towards one of the other portable telephone devices that is selected as the counterpart substation.

It may appear at a first glance that the low-pass filter 23 should be removed from each portable telephone device and should be installed in the base station in common to the portable telephone devices served by the base station. This is, however, not preferred. First, the illustrated portable telephone device must be compatible with conventional portable telephone devices. Second, the low-pass filter 23 removes the ultra voice frequency component of the noise component from the low-pass filtered signal. Furthermore, removal of the low-pass filter 23 only negligibly contributes to a reduction in weight of the portable telephone device being illustrated.

One of the other portable telephone devices may serve as an originating unit for supplying the illustrated portable telephone device with a talk signal representative of an originating talk. Alternatively, one of the fixed telephone units may be used as the originating unit. In either event, the base station produces the radio transmission signal for delivery to the portable telephone device under consideration.

In FIG. 1, the device radio transmitter/receiver 25 serves as a receiving arrangement for receiving, as a received signal, the radio transmission signal directed to the portable telephone device being illustrated. Furthermore, the receiving arrangement demodulates the received signal into a demodulated signal. A receiver circuit 27 comprises either a loudspeaker or a handset receiver. Supplied with the demodulated signal from the device radio transmitter/receiver 25, the receiver circuit 27 reproduces the originating talk. The user of the illustrated portable telephone device can listen to the originating talk. Inasmuch as the device radio transmitter/receiver 25 and the receiver circuit 27 are not different from those used in the conventional portable telephone device, details are not depicted and will no more be described insofar as FIG. 1 is concerned.

Reviewing FIG. 1, it should be pointed out that the microphone 11, the amplifier 13, and the high-pass filter 15 are not essential to this invention. The summing circuit input signal can consequently be referred to afresh as the audio signal. A connection 29 between the summing circuit 17 and the compressor circuit 21 serves as a supply arrangement. A combination of the low-pass filter 23 and the device radio transmitter/receiver 25 serves as a transmitting arrangement.

Under the circumstances, it is possible to say that the summing circuit 17 sums the audio signal and the generated signal altogether into the sum signal. The supply arrangement (29) supplies the sum signal to the compressor circuit 21 as the compressor circuit input signal. The transmitting arrangement (23, 25) transmits to the base station the compressed signal as the radio output signal carrying the audio signal.

Figure 2:
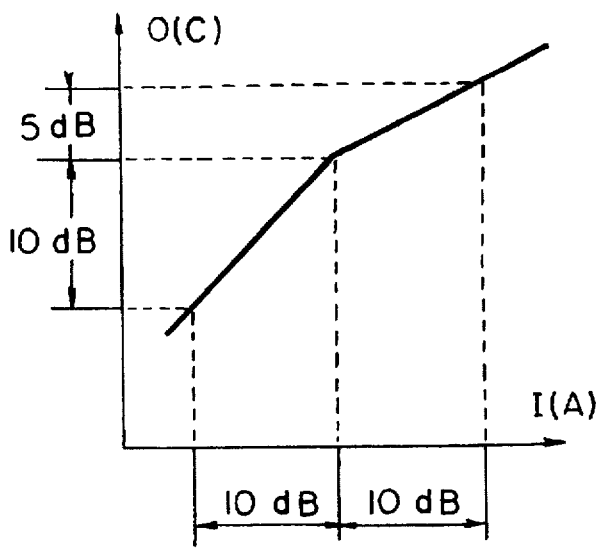
FIG. 2 exemplifies a joint input-to-output characteristic of a summing circuit and a compressor circuit which are used in the portable telephone device depicted in FIG. 1.

Turning to FIG. 2 with FIG. 1 continuously referred to, it may be mentioned here that the talk is spoken to the microphone 11 with an average talk level from which the pause or pauses may be put out of consideration. It will be presumed that the voice frequency component of the noise component has a noise level which is not higher than a maximum noise level. Being lower than the average talk level, the maximum noise level is a maximum allowable level which the surrounding noise may have and under which the illustrated portable telephone device is excellently operable.

The generated signal is given a predetermined signal level which is selected typically between minus 10 dB and minus 15 dB of the average talk level. When the predetermined signal level is higher than minus 10 dB of the average talk level, the talk signal component of the sum signal is subjected to an undue amplitude compression by the compressor circuit 21. When the predetermined signal level is lower than minus 15 dB of the average talk level, it is hardly possible to achieve technical advantages of this invention. It should be noted that the predetermined signal level will later be discussed.

In the manner described before, the summing circuit input signal or the high-pass filtered signal is afresh called the audio signal and is supplied to a combination of the summing circuit 17 and the compressor circuit 21 with the generated signal additionally supplied to the combination. The audio signal has an audio input level I(A) depicted along the abscissa in FIG. 2. The compressed signal has a compressor output level O(C) indicated along the ordinate.

The audio input level comprises lower and higher level ranges below and above a predetermined input level which is equal to the above-mentioned predetermined signal level and consequently to the maximum allowable level and at which a joint input-to-output characteristic of the summing and the compressor circuits 17 and 21 bends as exemplified in FIG. 2. As a result, the audio signal of the lower level range is subjected to a stronger amplitude compression than the audio signal of the higher level range. In other words, the joint input-to-output characteristic gives a less variable compressor gain to the audio signal having the audio input level in the lower level range than a wider variable compressor gain given to the audio signal having the audio input level in the higher level range.

It is readily understood that the audio input level is in the lower level range when the talk signal component is either weak or substantially zero in the audio signal so that the noise component is dominant in the audio signal. The audio input level is in the higher level range when the talk signal component is dominant in the audio signal.

If used alone without the summing circuit 17 and the signal generator 19 like in the conventional portable telephone device, the compressor circuit 21 has a compressor input-to-output characteristic which is linear. It will be assumed that the compressor circuit input signal is subjected to a compressor input level difference of 10 dB. In this event, the compressed signal is subjected to a compressor output level difference of 5 dB in the manner indicated in FIG. 2.

In accordance with the joint input-to-output characteristic exemplified in FIG. 2, an audio input level difference of 10 dB is amplitude compressed to the compressor output level difference of 5 dB when the audio signal has a higher level in the higher level range. In contrast, the audio input level difference of 10 dB is strongly amplitude compressed to provide the compressor output level difference of 10 dB when the audio signal has a lower level in the lower level range. It is now understood that the noise component is strongly amplitude compressed particularly during the pause or pauses in the talk.

Figure 3:
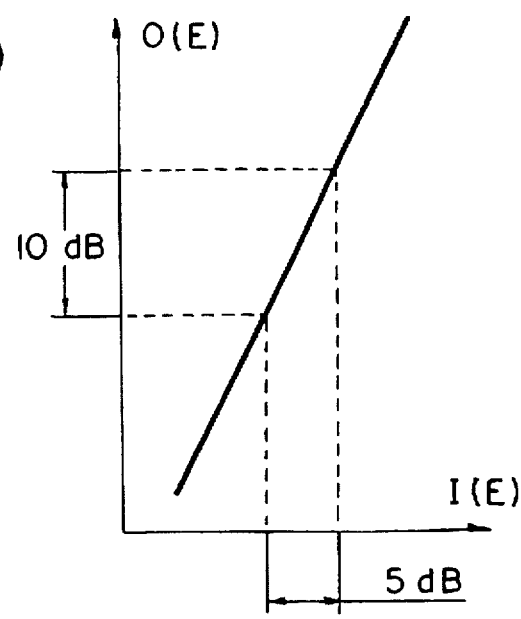
FIG. 3 exemplifies an expander input-to-output characteristic of an expander circuit which is used in a base station for the portable telephone device illustrated in FIG. 1.

Further turning to FIG. 3, an expander input level I(E) of the expander circuit of the base station is illustrated along the abscissa. An expander output level O(E) is depicted along the ordinate. In the manner exemplified, the expander circuit has an expander input-to-output characteristic which is linear. More particularly, an expander input level difference of 5 dB results in an expander output level difference of 10 db. This input-to-output characteristic is complementary to the input-to-output characteristic which the compressor circuit 21 alone has.

Figure 4:
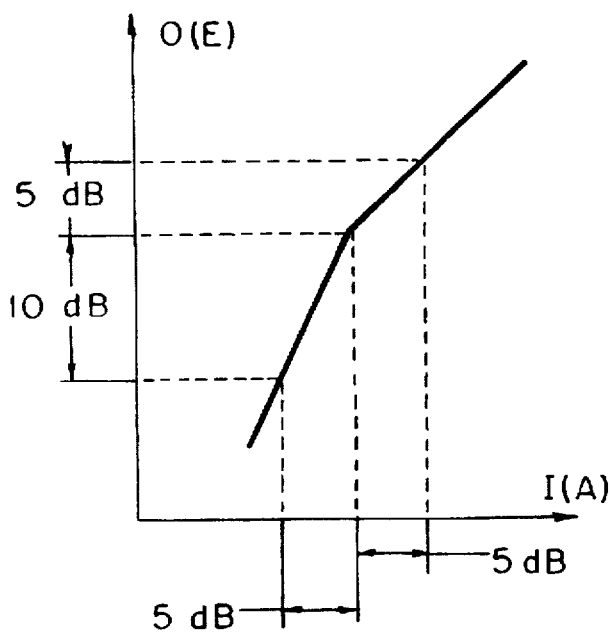
FIG. 4 shows an overall input-to-output characteristic of the joint and the expander input-to-output characteristics exemplified in FIGS. 2 and 3.

Referring now to Fig. 4 with FIG. 1 additionally referred to, an overall combination of the summing and the compressor circuits 17 and 21 and the expander circuit has an overall input-to-output characteristic illustrated by the expander input level O(E) versus the audio input level I(A), which levels are indicated along the ordinate and the abscissa. Like in FIG. 2, the overall input-to-output characteristic bends when the audio input level is equal to the predetermined input level.

Referring more particularly to FIG. 4, it is understood as follows. When the audio input level is in the higher level range, the audio input level difference of 5 dB results in the expander output level difference of 5 dB. As a consequence, the talk signal component is transmitted from the portable telephone device to the counterpart substation with its linearity kept. The audio input level difference of 5 dB, however, gives rise to the expander output level difference of 10 dB when the audio input level is in the lower level range. Consequently, the noise component is strongly amplitude compressed particularly during the pause or pauses in the talk.

Reviewing FIGS. 1 through 4, it may be pointed out here that the summing circuit 17 calculates the sum signal by giving a summing circuit gain to the audio signal and to the generated signal. It is therefore more preferred, than giving the predetermined signal level to the generated signal, that the compressor circuit input signal should be given the compressor input level which is rendered the predetermined signal level higher by additional use of the generated signal. This fact should clearly be noted.

In view of this, the maximum allowable level is between minus 10 dB and minus 15 dB of the average talk level. It is possible to cope with a certain range of the maximum allowable level by adjusting the level of the generated signal and/or by adjusting the summing circuit gain. Another method of adjustment will later be described.

Figure 5:
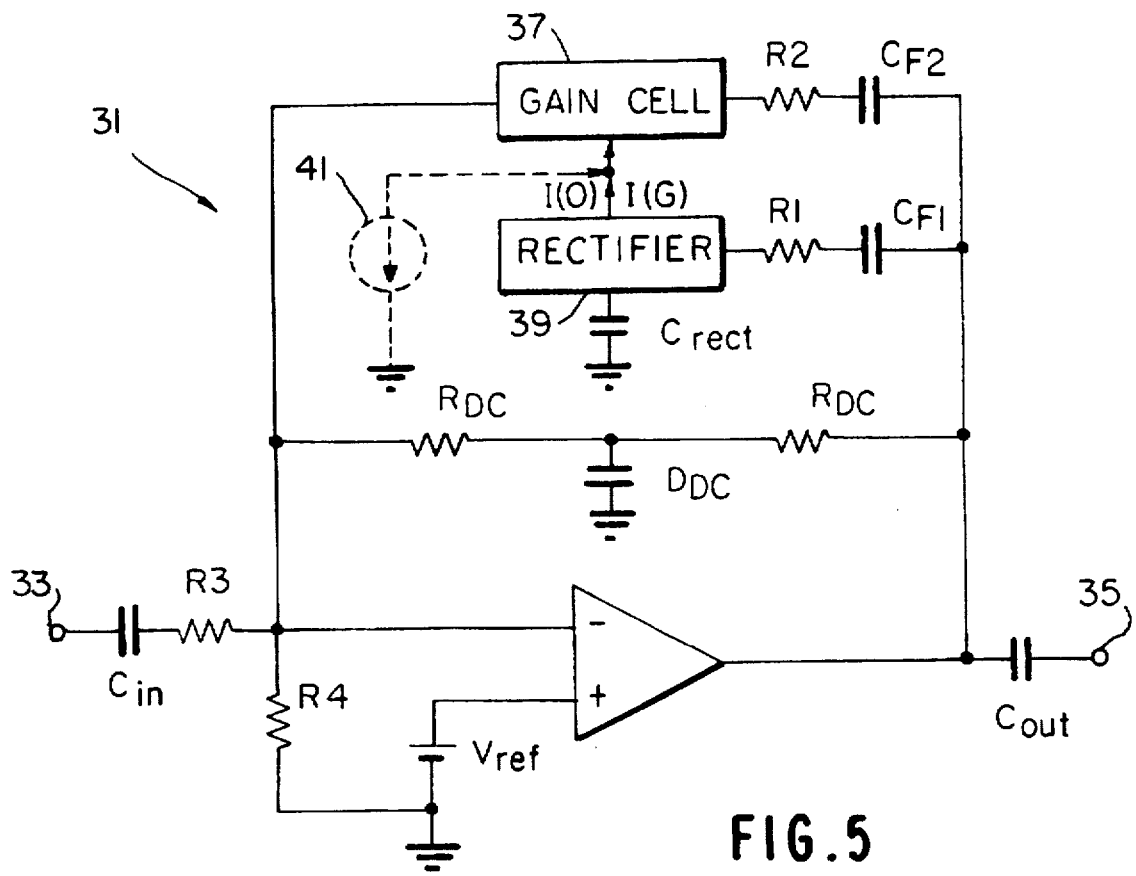
FIG. 5 shows partly in blocks an alternative compressor circuit for use in the portable telephone device illustrated in FIG. 1.

Referring now to FIG. 5 with FIG. 1 continually referred to, an alternative compressor circuit 31 is for use in a portable telephone device of the type being illustrated. That is, it is possible to substitute the compressor circuit 31 for the compressor circuit 21 described in conjunction with FIGS. 1 and 2. With reference numerals added and with an addition indicated by dashed lines, the compressor circuit 31 is depicted by solid lines as a substantial reproduction of a diagram illustrated on page 627 of a data book which is edited and published in the Japanese language by the NEC Corporation mentined before under the title of "1989 NEC sangyô-yô Rinia IC Dêta Bukku (in translation: 1989 NEC Data Book on Linear IC's for Industrial Use)".

The compressor sircuit 31 has circuit input and output terminals 33 and 35. The circuit input terminal 33 is supplied from the summing circuit 17 with the compressor circuit input signal, namely, the sum signal. The circuit output terminal 35 is for supplying the compressed signal to the low-pass filter 23. The compressor circuit input signal has the compressor input level which is now indicated by I(C). The compressed signal has the compressor output level O(C) as in FIG. 2.

The compressor circuit 31 comprises again cell 37, a rectifier 39, and other circuit elements, all of which are described in detail in the above-named data book. The rectifier 39 is for supplying a gain control signal I(G) to the gain cell 37. Thus far, the compressor circuit 31 is not different from the integrated circuit µPC15715C.

For use as the alternative compressor circuit 31, a constant current source 41 is connected across a combination of the rectifier 39 and a rectifier capacitor. Incidentally, it appears that another grounding capacitor should be labelled "$C_{DC}$" although labelled "$D_{DC}$" in FIG. 5 in accordance with the data book being referred to. In any event, the constant current source 41 is for superposing a constant current I(O) on the gain control signal I(G).

Figure 6:
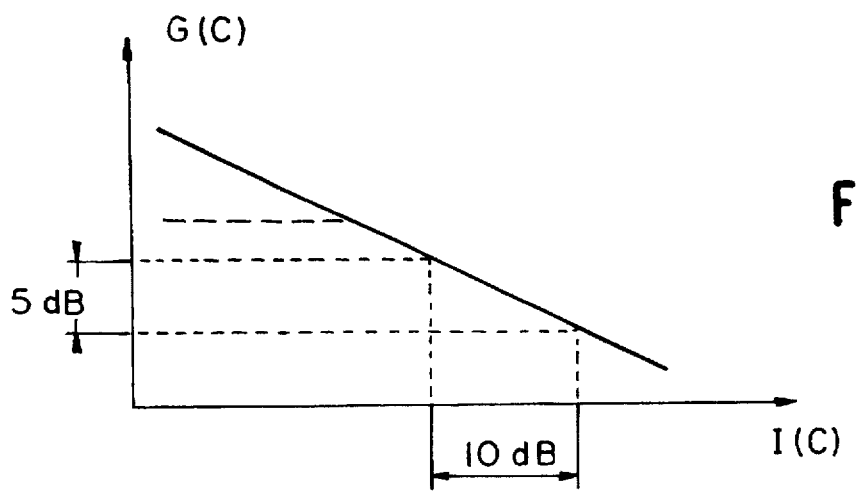
FIG. 6 shows a compressor gain versus a circuit input signal of the compressor circuit depicted in FIG. 5.

Turning to FIG. 6 with reference to FIG. 5 continued, it will be assumed that the constant current is not superposed on the gain control signal at first. The compressor circuit 31 has a compressor gain which is inversely proportional to a square root of the compressor input level I(C) in the manner which is exemplified by a solid straight line, and is pointed out in connection with FIG. 1. The compressor gain is indicated by G(C) along the ordinate. This compressor gain gives a variation of 5 dB to the compressor output level when the compressor input level is subjected to a variation of 10 dB.

It will now be assumed that the constant current I(O) is superposed on the gain control signal I(G). In this event, the compressor gain is kept constant as indicated by a dashed line if the compressor input level is below a predetermined compressor input level. It is therefore possible to select the constant current to render the predetermined compressor input level equal to the predetermined input level mentioned in conjunction with FIG. 2. Such a constant current may be equal to 6.3 microamperes if the predetermined input level should be 10 dB lower than the average talk level.

Reviewing FIGS. 1, 5, and 6, it is understood that the compressor input level comprises lower and higher level ranges below and above the predetermined input level like the audio input level described in connection with FIG. 2. The compressor input-to-output characteristic gives a less variable compressor gain to the compressor circuit input signal of the lower level range than to a wider variable compressor gain given to the compressor circuit input signal of the higher level range.

More in particular, the compressor input-to-output characteristic gives the compressor circuit input signal of the lower level range with a substantially constant compressor gain and the compressor circuit input signal of the higher level range a compressor gain which is inversely proportional substantially to a square root of the compressor input level in the higher level range. As a consequence, substitution of the alternative compressor circuit 31 for the compressor circuit 21 of FIG. 1 makes it possible to equally well achieve the technical advantages of this invention.

This equally well applies to the joint input-to-output characteristic. More specifically, the joint input-to-output characteristic gives the audio signal of the lower level range a substantially constant compressor gain and the audio signal of the higher level a compressor gain which is inversely proportional substantially to a square root of the audio input level in the higher level range.

Figure 7:
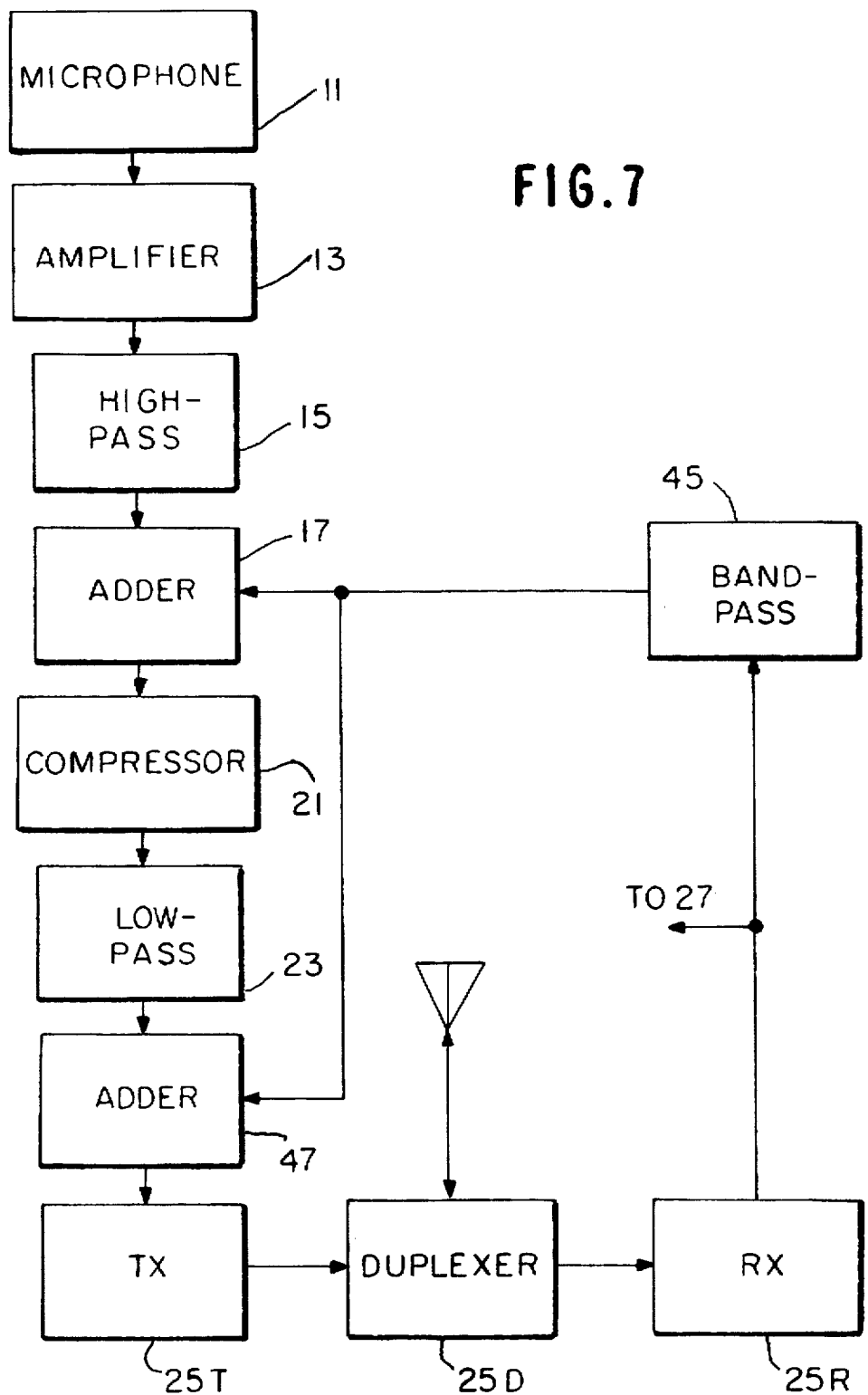
FIG. 7 is a block diagram of a mobile telephone device according to a second embodiment of this invention.

Referring to FIG. 7, the description will now proceed to a mobile telephone device according to a second embodiment of this invention. The mobile telephone device is for use in a radio communication system of the type disclosed in U.S. Pat. No. 4,025,853 referenced heretobefore and comprises similar parts which are designated by like reference numerals and are similarly operable with likewise named signals. It will be presumed merely for brevity of the description that the compressor circuit 21 is that described in connection with FIGS. 1 and 2 rather than the alternative compressor circuit 31 illustrated with reference to FIGS. 5 and 6.

The device radio transmitter/receiver 25 of FIG. 1 is now depicted as a combination of a radio transmitter (TX) 25T, a radio receiver (RX) 25R, and a duplexer 25D. Receiving, as a received signal, through the duplexer 25D from the base. station a radio transmission signal carrying a supervisory audible tone (SAT) which is unique to the radio transmission signal under consideration and has an audible frequency in the out-of audio frequency band, such as at 6 kHz, the radio receiver 25R produces a demodulated signal on which the supervisory audible tone is superimposed.

A band-pass filter 45 separates the supervisory audible tone from the demodulated signal as a separated audible tone. Inasmuch as the demodulated signal is derived from the received signal, it is possible to understand that the separated audible tone is separated from the received signal. The demodulated signal is delivered furthermore to the receiver circuit 27 described in conjunction with FIG. 1.

When the illustrated mobile telephone device is compared with the portable telephone device illustrated with reference to FIG. 1, the band-pass filter 45 is used as the signal generator 19 depicted in FIG. 1. Being the supervisory audible tone carried by the received signal, the separated audible tone has the audible frequency and is used as the generated signal described in connection with FIG. 1. Consequently, the summing and the compressor circuits 17 and 21 are operable in the manner described in conjunction with FIGS. 1 through 4.

Preferably, an additional summing circuit or adder 47 is connected between the low-pass filter 23 and the radio transmitter 25T. The summing circuit 47 produces an additional sum signal by summing the low-pass filtered signal and the separated audible tone altogether. In place of the low-pass filtered signal, the additional sum signal is supplied to the radio transmitter 25T and is modulated into the radio output signal for transmission to the base station through the duplexer 25D.

Figure 8:
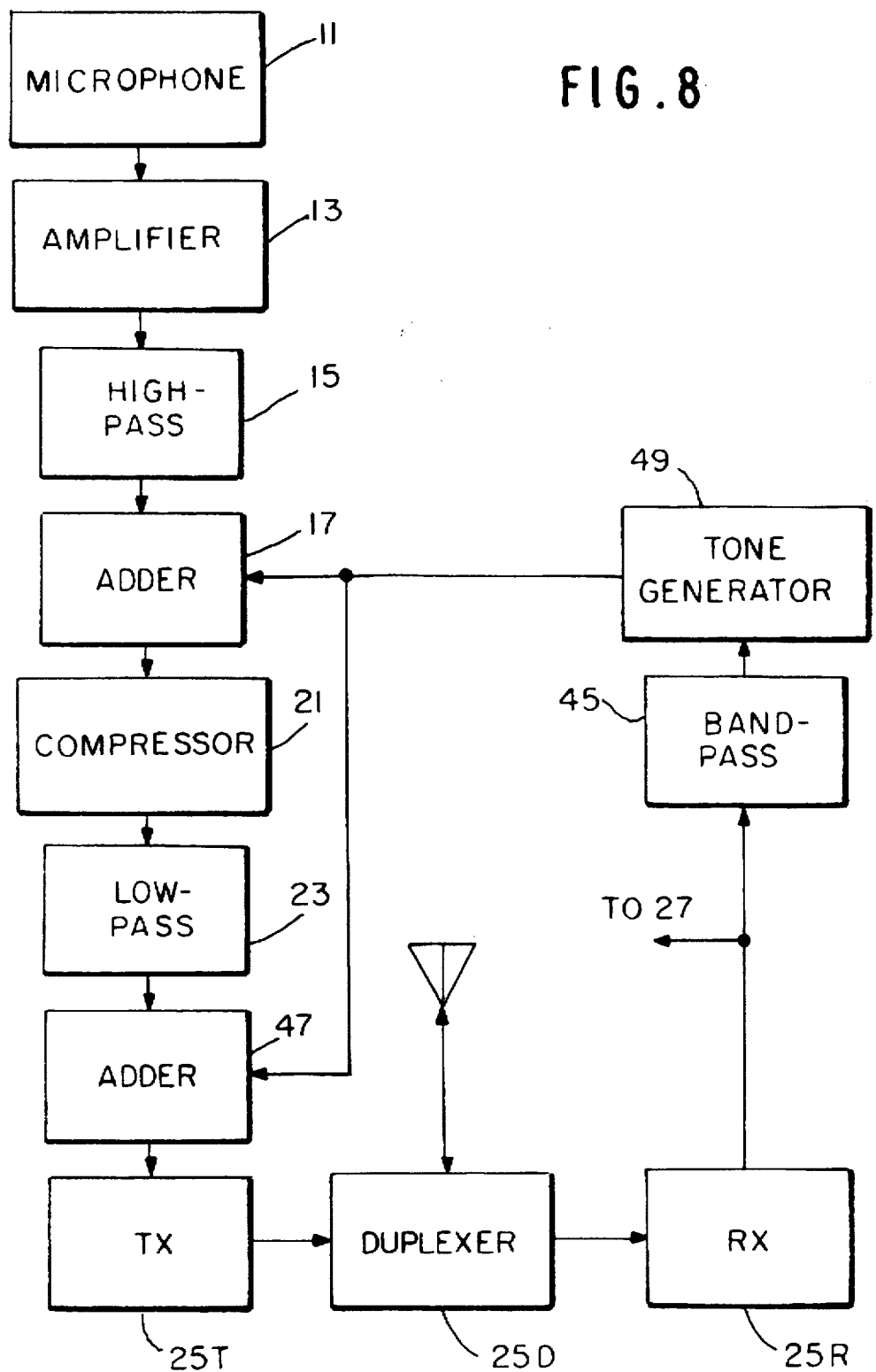
FIG. 8 is a block diagram of a mobile telephone device which is a modification of the mobile telephone device shown in FIG. 7.

Turning to FIG. 8, attention will be directed to a mobile telephone device which is a modification of the mobile telephone device illustrated with reference to FIG. 7. In FIG. 8, the mobile telephone device is capable of transmitting to the base station the verification signal described hereinabove and comprises similar parts which are designated again by like reference numerals and are similarly operable with likewise named signals.

Like in FIG. 7, the radio receiver 25R produces the demodulated signal on which the supervisory audible tone is superimposed. The band-pass filter 45 produces the separated audible tone. Supplied with the separated audible tone, a tone generator 49 generates a reference tone which is related to the separated audible tone in the manner described in the U.S. Pat. No. 4,025,853 being referred to and which has an audible frequency, such as 5988 or 6016 Hz, in the out-of audio frequency band.

The tone generator 49 is now used as the signal generator 19 described in conjunction with FIG. 1. The reference tone is used as the generated signal. It is consequently obvious that the summing and the compressor circuits 17 and 21 are collectively operable in the manner which is described in connection with FIGS. 1 through 4.

Preferably, the additional summing circuit 47 is supplied with the reference tone. In this case, the summing circuit 47 produces the additional sum signal by summing the low-pass filtered signal and the reference tone altogether. The radio transmitter produce the radio output signal as the above-mentioned verification signal. Alternatively, the additional summing circuit 47 can be supplied with the separated audible tone in the manner described in connection with FIG. 7.

Reviewing FIGS. 7 and 8, it is possible to use the alternative compressor circuit 31 in place of the compressor circuit 21 described in connection with FIGS. 1 and 2. In this event, various ranges of the maximum allowable level of the noise component should be coped with by adjusting the constant current I(O) used in the compressor circuit 31 and/or by adjusting the predetermined signal level of the generated signal and/or the summing circuit gain with the constant current accordingly adjusted so as to optimize the afore-mentioned predetermined compressor input level.

While this invention has thus far been described in specific conjunction with a few preferred embodiments thereof and a few modifications, it will now be readily possible for one skilled in the art to put this invention into practice in various other manners. For example, it is possible to make the joint input-to-output characteristic give a compressor gain which is inversely proportional substantially to a different power of the audio input level I(A) of the higher level range provided that the different power is a power of less than unity. This equally well applies to the compressor input-to-output characteristic.

What is claimed is:

1. A mobile telephone device for producing a radio output signal carrying an audio signal, said mobile telephone device including a noise-reducing compressor circuit for subjecting a circuit input signal to amplitude compression to produce a compressed signal, wherein said compressor circuit comprises:

a gain cell for controlling a compression level of said audio signal in response to a gain control signal;

a rectifier for supplying said gain control signal to said gain cell in response to the level of said audio signal; and a constant current source, connected to a junction of said gain cell and rectifier, for superposing a constant current on said gain control signal;

said audio signal comprising a talk signal component and a noise component having a noise level lower than a maximum allowable level, said talk signal component having a talk level higher in average than said maximum allowable level, said audio signal having lower and higher level ranges lower and higher than said maximum allowable level, respectively, wherein said compressor circuit is given a joint input-to-output characteristic for giving a less variable gain to the audio signal of said lower level range than to the audio signal of said higher level range by superposing said constant current on said gain control signal such that the noise component is strongly compressed during pause or pauses in the talk signal component.

2. The mobile telephone device as claimed in claim 1, wherein said joint input-to-output characteristic gives the audio signal of said lower level range a substantially constant gain and the audio signal of said higher level range a gain which is inversely proportional substantially to a square root of a level in said higher level range.

* * * * *